(12) United States Patent
Negley et al.

(10) Patent No.: US 8,264,138 B2  
(45) Date of Patent: Sep. 11, 2012

(54) SHIFTING SPECTRAL CONTENT IN SOLID STATE LIGHT EMITTERS BY SPATIALLY SEPARATING LUMIPHOR FILMS

(75) Inventors: Gerald H. Negley, Durham, NC (US); Antony Paul Van De Ven, Sai Kung (HK)

(73) Assignee: Cree, Inc., Durham, NC (US)

( * ) Notice: Subject to any disclaimer, the term of this patent is extended or adjusted under 35 U.S.C. 154(b) by 595 days.

(21) Appl. No.: 11/624,811

(22) Filed: Jan. 19, 2007

(65) Prior Publication Data

US 2007/0170447 A1    Jul. 26, 2007

Related U.S. Application Data

(60) Provisional application No. 60/794,379, filed on Apr. 24, 2006, provisional application No. 60/761,310, filed on Jan. 23, 2006, provisional application No. 60/760,455, filed on Jan. 20, 2006.

(51) Int. Cl.  
*H01J 1/62* (2006.01)

(52) U.S. Cl. .................................. 313/495; 313/498

(58) Field of Classification Search .......... 313/498–512; 445/24–25  
See application file for complete search history.

(56) References Cited

U.S. PATENT DOCUMENTS

| | | |
|---|---|---|
| 4,042,552 A | 8/1977 | Grucza |
| 4,107,238 A | 8/1978 | Roper et al. |
| 4,141,941 A | 2/1979 | Travnicek |
| 4,320,268 A | 3/1982 | Brown |
| 4,337,506 A | 6/1982 | Terada |
| 4,388,678 A | 6/1983 | Turner |
| 4,562,018 A | 12/1985 | Neefe |
| 4,826,424 A | 5/1989 | Arai et al. |
| 4,918,497 A | 4/1990 | Edmond |
| 4,933,822 A | 6/1990 | NakaMats |
| 4,966,862 A | 10/1990 | Edmond |
| 4,994,946 A | 2/1991 | NakaMats |
| 5,027,168 A | 6/1991 | Edmond |
| 5,087,949 A | 2/1992 | Haitz |
| 5,110,278 A | 5/1992 | Tait et al. |
| 5,134,550 A | 7/1992 | Young |
| 5,143,660 A | 9/1992 | Hamilton et al. |
| 5,210,051 A | 5/1993 | Carter, Jr. |

(Continued)

FOREIGN PATENT DOCUMENTS

EP    1 198 016    4/2002

(Continued)

OTHER PUBLICATIONS

U.S. Appl. No. 11/939,059, filed Nov. 13, 2007.

(Continued)

*Primary Examiner* — Anne Hines  
(74) *Attorney, Agent, or Firm* — Burr & Brown

(57) ABSTRACT

A lighting device, comprising at least one solid state light emitter, at least one first lumiphor and at least one second lumiphor which is spaced from the first lumiphor. The solid state light emitter can be a light emitting diode. A method of making a lighting device, comprising positioning at least one second lumiphor spaced from and outside of at least one first lumiphor relative to at least one solid state light emitter. A method of lighting, comprising providing electricity to at least one solid state light emitter in such a lighting device.

18 Claims, 4 Drawing Sheets

U.S. PATENT DOCUMENTS

Figure 1:
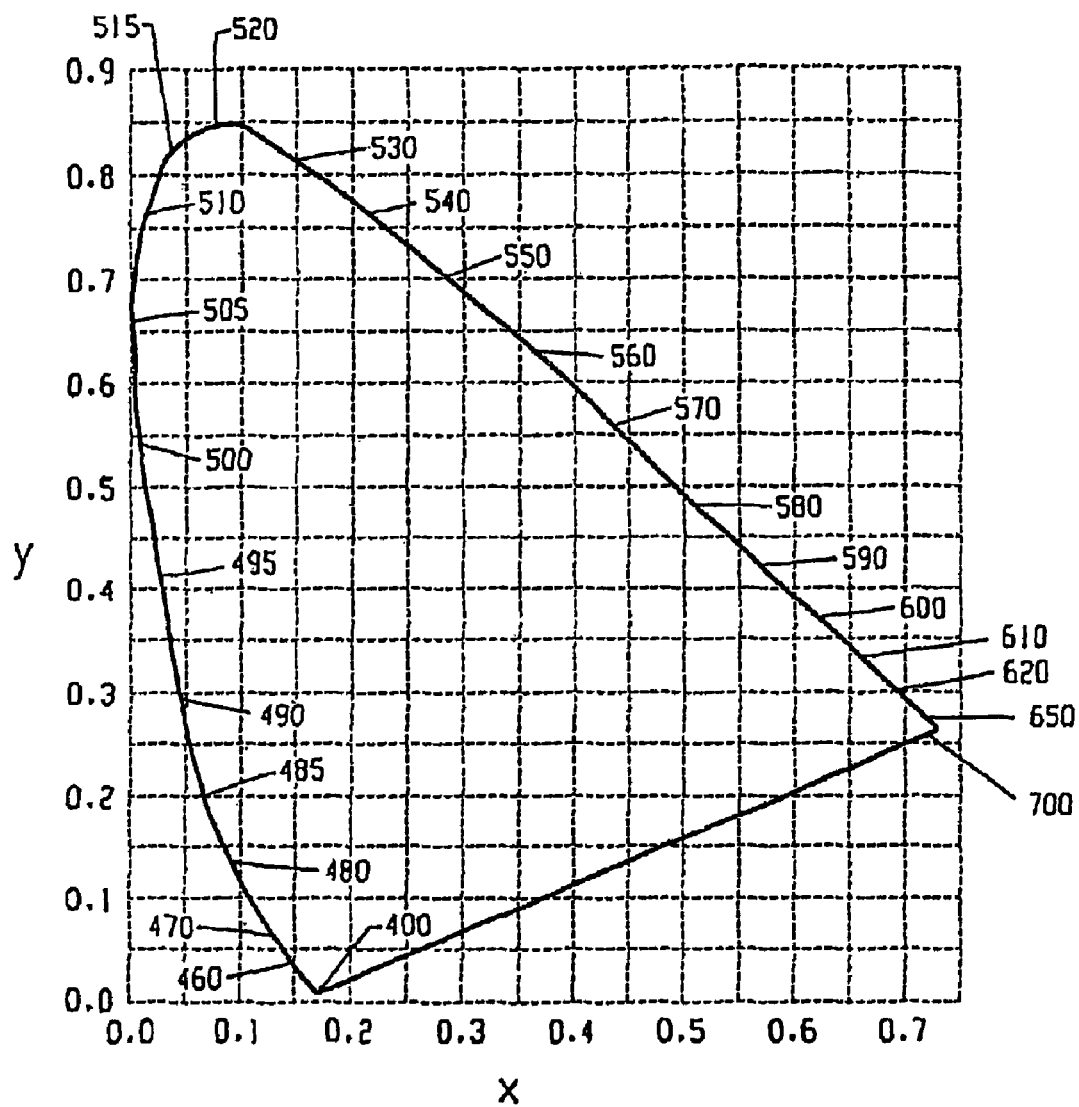

| | | | |
|---|---|---|---|
| 5,277,840 A | 1/1994 | Osaka et al. | |
| 5,338,944 A | 8/1994 | Edmond et al. | |
| 5,374,668 A | 12/1994 | Kanemura et al. | |
| 5,393,993 A | 2/1995 | Edmond et al. | |
| 5,416,342 A | 5/1995 | Edmond et al. | |
| 5,477,430 A | 12/1995 | LaRose | |
| 5,523,589 A | 6/1996 | Edmond et al. | |
| 5,575,550 A | 11/1996 | Appeldorn et al. | |
| 5,604,135 A | 2/1997 | Edmond et al. | |
| 5,631,190 A | 5/1997 | Negley | |
| 5,669,486 A | 9/1997 | Shima | |
| 5,739,554 A | 4/1998 | Edmond et al. | |
| 5,753,730 A | 5/1998 | Nagata et al. | |
| 5,779,924 A | 7/1998 | Krames et al. | |
| 5,813,753 A | 9/1998 | Vriens et al. | |
| 5,851,063 A | 12/1998 | Doughty et al. | |
| 5,858,278 A | 1/1999 | Itoh et al. | |
| 5,882,553 A | 3/1999 | Prophet et al. | |
| 5,906,425 A | 5/1999 | Gordin et al. | |
| 5,912,477 A | 6/1999 | Negley | |
| 5,959,316 A | 9/1999 | Lowery | |
| 5,968,422 A | 10/1999 | Kennedy | |
| 6,066,861 A | 5/2000 | Hohn et al. | |
| 6,069,440 A | 5/2000 | Shimizu et al. | |
| 6,071,795 A | 6/2000 | Cheung et al. | |
| 6,120,600 A | 9/2000 | Edmond et al. | |
| 6,155,699 A | 12/2000 | Miller et al. | |
| 6,156,242 A | 12/2000 | Saito et al. | |
| 6,177,688 B1 | 1/2001 | Linthicum et al. | |
| 6,187,606 B1 | 2/2001 | Edmond et al. | |
| 6,201,262 B1 | 3/2001 | Edmond et al. | |
| 6,234,648 B1 | 5/2001 | Borner et al. | |
| 6,252,254 B1 | 6/2001 | Soules et al. | |
| 6,329,676 B1 | 12/2001 | Takayama et al. | |
| 6,346,973 B1 | 2/2002 | Shibamoto et al. | |
| 6,373,188 B1 | 4/2002 | Johnson et al. | |
| 6,383,417 B1 | 5/2002 | Paulson et al. | |
| 6,391,231 B1 | 5/2002 | Evans et al. | |
| 6,404,125 B1 | 6/2002 | Garbuzov et al. | |
| 6,404,131 B1 | 6/2002 | Kawano et al. | |
| 6,420,199 B1 | 7/2002 | Coman et al. | |
| 6,504,180 B1 | 1/2003 | Heremans et al. | |
| 6,521,915 B2 | 2/2003 | Odaki et al. | |
| 6,559,075 B1 | 5/2003 | Kelley et al. | |
| 6,573,653 B1 | 6/2003 | Ishingaga | |
| 6,576,930 B2 | 6/2003 | Reeh et al. | |
| 6,600,175 B1 | 7/2003 | Baretz et al. | |
| 6,601,984 B2 | 8/2003 | Yamamoto et al. | |
| 6,635,363 B1 * | 10/2003 | Duclos et al. | 428/690 |
| 6,657,236 B1 | 12/2003 | Thibeault et al. | |
| 6,730,939 B2 | 5/2004 | Eisert et al. | |
| 6,734,465 B1 | 5/2004 | Taskar et al. | |
| 6,744,077 B2 | 6/2004 | Trottier | |
| 6,800,500 B2 | 10/2004 | Coman et al. | |
| 6,809,347 B2 | 10/2004 | Tasch et al. | |
| 6,841,804 B1 | 1/2005 | Chen et al. | |
| 6,853,131 B2 | 2/2005 | Srivastava et al. | |
| 6,871,982 B2 * | 3/2005 | Holman et al. | 362/331 |
| 6,960,878 B2 | 11/2005 | Sakano et al. | |
| 7,029,935 B2 | 4/2006 | Negley et al. | |
| 7,040,774 B2 | 5/2006 | Beeson et al. | |
| 7,144,131 B2 | 12/2006 | Rains | |
| 7,261,441 B2 | 8/2007 | Ng et al. | |
| 7,264,378 B2 | 9/2007 | Loh et al. | |
| 7,265,488 B2 * | 9/2007 | Ng et al. | 313/501 |
| 7,293,908 B2 | 11/2007 | Beeson et al. | |
| 7,360,937 B2 | 4/2008 | Han et al. | |
| 2001/0009510 A1 | 7/2001 | Lodhie | |
| 2002/0015013 A1 | 2/2002 | Ragle | |
| 2002/0068201 A1 | 6/2002 | Vaudo et al. | |
| 2002/0084748 A1 | 7/2002 | Ayala et al. | |
| 2002/0093820 A1 | 7/2002 | Pederson | |
| 2002/0123164 A1 | 9/2002 | Slater, Jr. et al. | |
| 2002/0172354 A1 | 11/2002 | Nishi | |
| 2002/0196638 A1 | 12/2002 | Stephens et al. | |
| 2003/0001166 A1 | 1/2003 | Waalib-Singh et al. | |
| 2003/0006418 A1 | 1/2003 | Emerson et al. | |
| 2003/0038295 A1 | 2/2003 | Koda | |
| 2003/0067758 A1 | 4/2003 | Shipman | |
| 2003/0111667 A1 | 6/2003 | Schubert | |
| 2003/0113108 A1 | 6/2003 | Bittner | |
| 2003/0127660 A1 * | 7/2003 | Bawendi et al. | 257/89 |
| 2003/0128341 A1 | 7/2003 | Li | |
| 2003/0153861 A1 | 8/2003 | Royer | |
| 2003/0165061 A1 | 9/2003 | Martineau | |
| 2003/0173575 A1 | 9/2003 | Eisert et al. | |
| 2003/0230751 A1 | 12/2003 | Harada | |
| 2004/0041222 A1 | 3/2004 | Loh | |
| 2004/0056260 A1 | 3/2004 | Slater, Jr. et al. | |
| 2004/0095763 A1 | 5/2004 | Guerrieri et al. | |
| 2004/0184270 A1 | 9/2004 | Halter | |
| 2004/0218391 A1 | 11/2004 | Procter | |
| 2004/0223223 A1 | 11/2004 | Lee | |
| 2004/0252502 A1 | 12/2004 | McCullough et al. | |
| 2005/0094401 A1 | 5/2005 | Magarill | |
| 2005/0105301 A1 | 5/2005 | Takeda et al. | |
| 2005/0128744 A1 | 6/2005 | You et al. | |
| 2005/0151138 A1 | 7/2005 | Slater, Jr. et al. | |
| 2005/0156496 A1 | 7/2005 | Takashima et al. | |
| 2005/0190559 A1 | 9/2005 | Kragl | |
| 2005/0215000 A1 | 9/2005 | Negley | |
| 2005/0227379 A1 | 10/2005 | Donofrio | |
| 2005/0231953 A1 * | 10/2005 | Reeh et al. | 362/260 |
| 2005/0236628 A1 | 10/2005 | Matsuura | |
| 2005/0248958 A1 | 11/2005 | Li | |
| 2006/0002141 A1 | 1/2006 | Ouderkirk et al. | |
| 2006/0006402 A1 | 1/2006 | Hsieh et al. | |
| 2006/0012298 A1 | 1/2006 | Lee et al. | |
| 2006/0034084 A1 | 2/2006 | Matsuura et al. | |
| 2006/0056169 A1 | 3/2006 | Lodhie et al. | |
| 2006/0061259 A1 | 3/2006 | Negley | |
| 2006/0061988 A1 | 3/2006 | Johnson et al. | |
| 2006/0063289 A1 | 3/2006 | Negley et al. | |
| 2006/0092643 A1 | 5/2006 | Wong et al. | |
| 2006/0104060 A1 | 5/2006 | Kragl | |
| 2006/0105482 A1 | 5/2006 | Alferink et al. | |
| 2006/0145172 A1 | 7/2006 | Su et al. | |
| 2006/0181879 A1 | 8/2006 | Pederson | |
| 2006/0209558 A1 | 9/2006 | Chinniah et al. | |
| 2007/0024191 A1 | 2/2007 | Chen et al. | |
| 2007/0297179 A1 | 12/2007 | Leung et al. | |
| 2008/0030993 A1 | 2/2008 | Narendran et al. | |
| 2008/0054281 A1 | 3/2008 | Narendran et al. | |
| 2008/0094829 A1 | 4/2008 | Narendran et al. | |
| 2008/0105887 A1 | 5/2008 | Narendran et al. | |
| 2008/0117500 A1 | 5/2008 | Narendran et al. | |

FOREIGN PATENT DOCUMENTS

| | | |
|---|---|---|
| EP | 1 253 373 | 10/2002 |
| EP | 1 263 058 | 12/2002 |
| EP | 1 566 848 | 8/2005 |
| JP | 05-152609 | 6/1993 |
| JP | 06-151974 | 5/1994 |
| JP | 06-177429 | 6/1994 |
| JP | 06-244458 | 9/1994 |
| JP | 08-162676 | 6/1996 |
| JP | 09-246603 | 9/1997 |
| JP | 10-242513 | 9/1998 |
| JP | 11-261114 | 9/1999 |
| JP | 11-298047 | 10/1999 |
| JP | 2000-101147 | 4/2000 |
| JP | 2000-174347 | 6/2000 |
| JP | 2000-183405 | 6/2000 |
| JP | 2000-286455 | 10/2000 |
| JP | 2000-286458 | 10/2000 |
| JP | 2001-53341 | 2/2001 |
| JP | 2001-077427 | 3/2001 |
| JP | 2001-077433 | 3/2001 |
| JP | 2001-144334 | 5/2001 |
| JP | 2001-230453 | 8/2001 |
| JP | 2002-118293 | 4/2002 |
| JP | 2002-133938 | 5/2002 |
| JP | 2002-158378 | 5/2002 |
| JP | 2002-223004 | 8/2002 |
| JP | 2002-280616 | 9/2002 |
| JP | 2003-017755 | 1/2003 |
| JP | 2004-56075 | 2/2004 |

| | | |
|---|---|---|
| JP | 2004-191718 | 7/2004 |
| JP | 2005-8844 | 1/2005 |
| JP | 2005-277127 | 10/2005 |
| WO | 97/24706 | 7/1997 |
| WO | 01/61764 | 8/2001 |
| WO | 02/059982 | 8/2002 |
| WO | 2004/068597 A2 | 8/2004 |
| WO | 2004/100226 A2 | 11/2004 |
| WO | 2005/055328 | 6/2005 |
| WO | 2005/078338 | 8/2005 |
| WO | 2005/104253 | 11/2005 |
| WO | 2006/039017 | 4/2006 |
| WO | WO 2006/061728 | 6/2006 |
| WO | 2007/002234 | 1/2007 |

OTHER PUBLICATIONS

LEDsMagazine, *Technology and Applications of LEDs*, Apr. 14, 2005, http://www.ledsmagazine.com/news/2/4/22, pp. 1.

High Efficiency, Nitride-Based, Solid-State Lighting, Summary of UCSB Research, Summary of LRC Research, www.1rc.rpi.edu/programs/solidstate/cr_nitridebasedssl.asp, pp. 1-2, (date not known).

Narendran, *Improving the performance of mixed-color white LED systems by using scattered photon extraction technique*, 2007 Copyright SPIE, The International Society for Optical Engineering, Seventh International Conference on Solid State Lighting, Proceedings of SPIE, Sep. 17, 2007, pp. 1-2.

Narendran, *Improved Performance White LED*, Nov. 2005, Society of Photo-Optical Instrumentation Engineers, Fifth International Conference on Solid State Lighting, Proceedings of SPIE 5941, pp. 1-7.

Narendran et al., Extracting phosphor-scattered photons to improve white LED efficiency, Wiley InterScience :: JOURNALS :: physica status solidi (a), Rapid Research Letter, Mar. 17, 2005, http://www3.interscience.wiley.com/journal/110437401/abstract, Abstract.

LRC Solid-State Lighting Papers and Publications, pp. 1-4, Feb. 2, 2006.

Craford, "Overview of Device Issues in High-Brightness Light-Emitting Diodes," Chapter, *High Brightness Light Emitting Diodes: Semiconductors and Semimetals*, vol. 48, Stringfellow et al. ed., Academic Press, 1997, pp. 47-63.

Nichia, White LED, Part Nos. NSPW300BS, "Specifications for Nichia White LED, Model NSPW300BS," Nichia Corporation, Jan. 12, 2004.

Nichia, White LED, Part Nos. NSPW312BS, "Specifications for Nichia White LED, Model NSPW312BS," Nichia Corporation, Jan. 14, 2004.

"An Even Brighter Idea," Economist.com, http://www.economist.com/science/tq/PrinterFriendly.cfm?story_id=7904236; Sep. 22, 2006 (Science Technology Quarterly) pp. 1-6.

Boehlen et al., "Laser micro-machining of high density optical structures on large substrates," Proc. of SPIE vol. 5339, 2004, pp. 118-126.

U.S. Appl. No. 11/613,692, filed Dec. 20, 2006.
U.S. Appl. No. 11/614,180, filed Dec. 21, 2006.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/755,162, filed May 30, 2007.
U.S. Appl. No. 11/856,421, filed Sep. 17, 2007.
U.S. Appl. No. 11/854,744, filed Sep. 13, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/947,323, filed Nov. 29, 2007.
U.S. Appl. No. 12/035,604, filed Feb. 22, 2008.
U.S. Appl. No. 11/708,818, filed Feb. 21, 2007.
U.S. Appl. No. 11/476,520, filed Jun. 27, 2006.
U.S. Appl. No. 61/047,824, filed Apr. 25, 2008.

Zhu et al., "Optimizing the Performance of Remote Phosphor LED," First International Conference on White LEDs and Solid State Lighting, 2007, pp. 1-5.

Kim et al., "Strongly Enhanced Phosphor Efficiency in GaInN White Light-Emitting Diodes Using Remote Phosphor Configuration and Diffuse Reflector Cup", Japanese Journal of Applied Physics, vol. 44, Nov. 21, 2005, pp. L649-L651.

* cited by examiner

SHIFTING SPECTRAL CONTENT IN SOLID STATE LIGHT EMITTERS BY SPATIALLY SEPARATING LUMIPHOR FILMS

CROSS-REFERENCE TO RELATED APPLICATIONS

This application claims the benefit of U.S. Provisional Patent Application No. 60/760,455, filed Jan. 20, 2006, the entirety of which is incorporated herein by reference.

This application claims the benefit of U.S. Provisional Patent Application No. 60/761,310, filed Jan. 23, 2006, the entirety of which is incorporated herein by reference.

This application claims the benefit of U.S. Provisional Patent Application No. 60/794,379, filed Apr. 24, 2006, the entirety of which is incorporated herein by reference.

FIELD OF THE INVENTION

The present invention relates to a lighting device, in particular, a device which includes one or more solid state light emitters (e.g., light emitting diodes) and at least two lumiphor elements, each lumiphor element containing at least one luminescent material (e.g., one or more phosphors). The present invention is also directed to lighting methods, and to methods of making lighting devices.

BACKGROUND OF THE INVENTION

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient as compared to solid state light emitting devices, e.g., light emitting diodes.

In addition, as compared to the normal lifetimes of light emitting diodes, incandescent light bulbs have relatively short lifetimes, i.e., typically about 750-1000 hours. In comparison, the lifetime of light emitting diodes, for example, can generally be measured in decades. Fluorescent bulbs have longer lifetimes (e.g., 10,000-20,000 hours) than incandescent lights, but provide less favorable color reproduction. Color reproduction is typically measured using the Color Rendering Index (CRI Ra) which is a relative measure of the shift in surface color of an object when lit by a particular lamp. Daylight has the highest CRI (Ra of 100), with incandescent bulbs being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters, e.g., light emitting diodes, can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI Ra), contrast, efficacy (lm/W), and/or duration of service.

Light emitting diodes are semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor-based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of solid state light emitters has in many ways revolutionized the lighting industry, some of the characteristics of solid state light emitters have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI).

Because light that is perceived as white is necessarily a blend of light of two or more colors (or wavelengths), no single light emitting diode junction has been developed that can produce white light. "White" light emitting diodes have been produced which have a light emitting diode pixel formed of respective red, green and blue light emitting diodes. Other "white" light emitting diodes have been produced which include (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In addition, the blending of primary colors to produce combinations of non-primary colors is generally well understood in this and other arts. In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of primary colors.

Solid state light emitters can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with solid state light emitters, e.g., to improve energy efficiency, color rendering index (CRI), efficacy (lm/W), and/or duration of service, are not limited to any particular color or color blends of light.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts light including photons of an energy level to light including photons of a higher energy level (shorter wavelength).

Inclusion of luminescent materials in LED devices has been accomplished by adding the luminescent materials to a clear plastic encapsulant material (e.g., epoxy-based or silicone-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lights" (i.e., lights which are perceived as being white or near-white) have been investigated as potential replacements for white incandescent lamps. A representative example of a white LED lamp includes a package of a blue light emitting diode chip, made of gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. For instance, in some designs, white light emitting diodes are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light.

Designs have been provided in which existing LED component packages and other electronics are assembled into a fixture. In such designs, a packaged LED is mounted to a circuit board, the circuit board is mounted to a heat sink, and the heat sink is mounted to the fixture housing along with required drive electronics. In many cases, additional optics (secondary to the package parts) are also necessary.

There is an ongoing need for ways to use solid state light emitters in a wider variety of applications, with greater energy efficiency, with improved color rendering index (CRI), with improved efficacy (lm/W), and/or with longer duration of service.

BRIEF SUMMARY OF THE INVENTION

In one aspect of the present invention, there is provided a lighting device, comprising:
at least one solid state light emitter;
at least one first lumiphor; and
at least one second lumiphor, the second lumiphor being spaced from the first lumiphor.

In some embodiments of this aspect of the present invention, a mixture of (1) light emitted by the at least one solid state light emitter and which exits from the at least one first lumiphor without being converted, and (2) light emitted by the at least one solid state light emitter which exits from the at least one first lumiphor after being converted by the at least one first lumiphor (i.e., by being absorbed by the at least one first lumiphor, thereby exciting the at least one first lumiphor, and then being "re-emitted" by the at least one first lumiphor) has x, y color coordinates which are within an area on a 1931 CIE Chromaticity Diagram enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.45, 0.35, the second point having x, y coordinates of 0.35, 0.45, the third point having x, y coordinates of 0.12, 0.22, and the fourth point having x, y coordinates of 0.20, 0.075.

In some embodiments of this aspect of the present invention, the solid state light emitter is a light emitting diode which emits light having a wavelength within the ultraviolet range or within the visible range up to a wavelength of 525 mm.

In another aspect of the present invention, there is provided a method of making a lighting device, comprising:

positioning at least one second lumiphor outside of at least one first lumiphor relative to at least one solid state light emitter, the second lumiphor being spaced from the first lumiphor.

In another aspect of the present invention, there is provided a method of lighting, comprising:

providing electricity to at least one solid state light emitter, the solid state light emitter being positioned within at least one first lumiphor, the at least one first lumiphor being spaced from at least one second lumiphor, the first lumiphor being positioned at least partially between the light emitting diode and the second lumiphor.

In another aspect of the present invention, there is provided a method of lighting, comprising:

providing electricity to at least one solid state light emitter, whereby the solid state light emitter emits light which passes from the solid state light emitter, through the first lumiphor, and then through the second lumiphor, the first lumiphor being spaced from the second lumiphor.

There exist "white" LED light sources which are relatively efficient but have a poor color rendering (e.g., Ra less then 75), and which are particularity deficient in the rendering of red colors and also to a significant extent deficient in green. This means that many things, including the typical human complexion, food items, labeling, painting, posters, signs, apparel, home decoration, plants, flowers, automobiles, etc. exhibit odd or wrong color as compared to being illuminated with an incandescent light or natural daylight. Typically, such white LEDs have a color temperature of approximately 5000K, which is generally not visually comfortable for general illumination, which, however, may be desirable for the illumination of commercial produce or advertising and printed materials.

Some so-called "warm white" LEDs have a more acceptable color temperature (typically 2700 to 3500K) for indoor use, and good CRI (in the case of a yellow and red phosphor mix as high as Ra=95), but their efficiency is much less then half that of the standard "white" LEDs.

Figure 2:
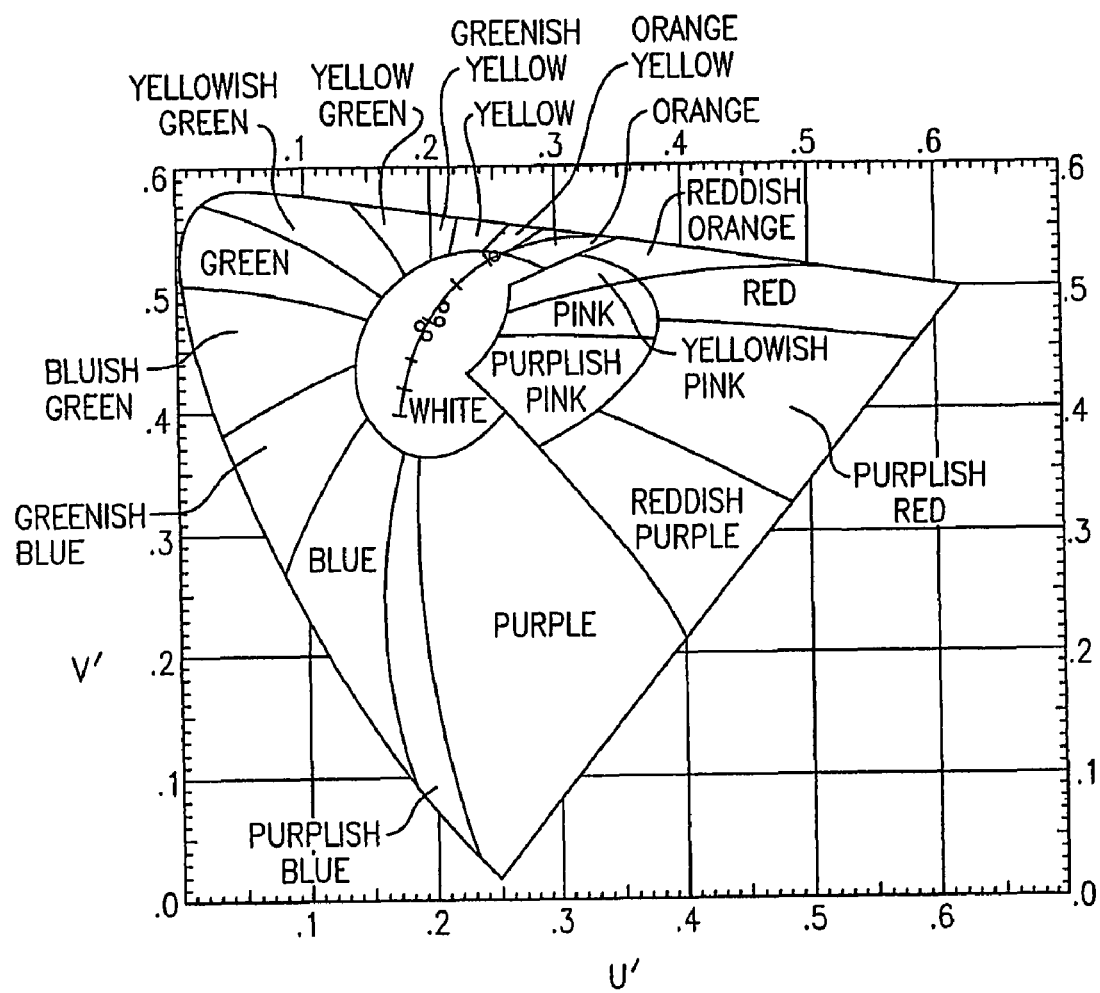
Figure 3:
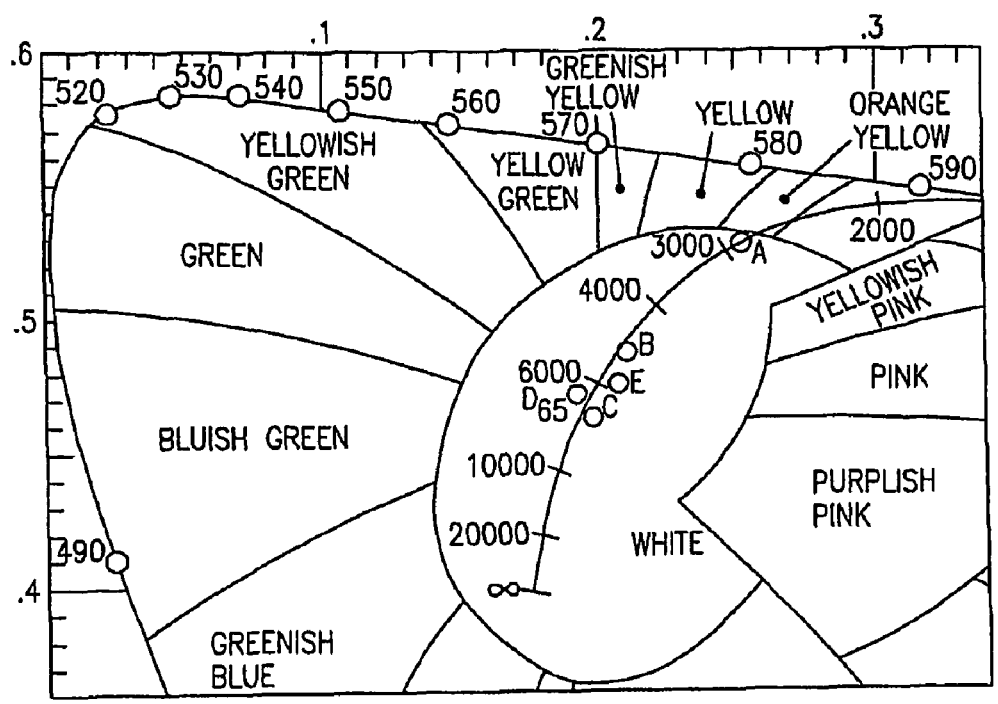

Aspects related to the present invention can be represented on either the 1931 CIE (Commission International de l'Eclairage) Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows an enlarged portion of the 1976 Chromaticity Diagram, in order to show the blackbody locus in more detail. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1-3 are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda)=A\lambda^{-5}/(e^{(B/T)}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

Also depicted on the 1976 CIE Diagram are designations A, B, C, D and E, which refer to light produced by several standard illuminants correspondingly identified as illuminants A, B, C, D and E, respectively.

CRI is a relative measurement of how the color rendition of an illumination system compares to that of a blackbody radiator or other defined reference. The CRI Ra equals 100 if the color coordinates of a set of test colors being illuminated by the illumination system are the same as the coordinates of the same test colors being irradiated by the reference radiator.

The present invention may be more fully understood with reference to the accompanying drawings and the following detailed description of the invention.

BRIEF DESCRIPTION OF THE DRAWING FIGURES

Figure 4:
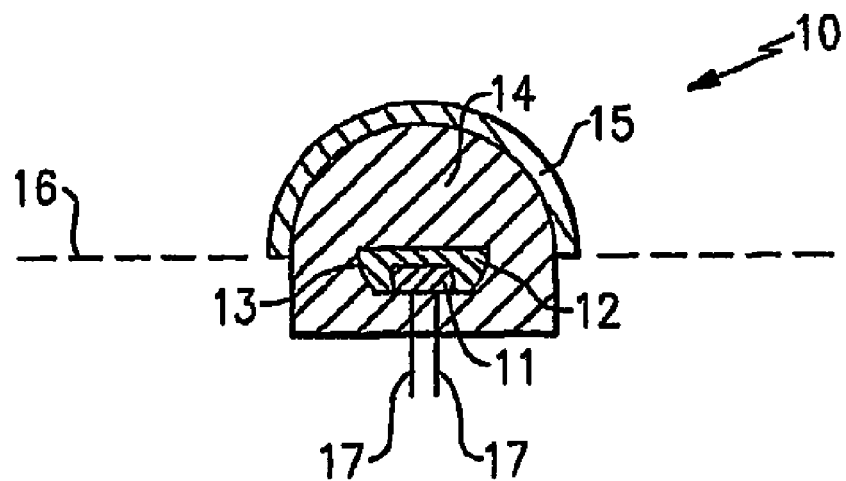
Figure 5:
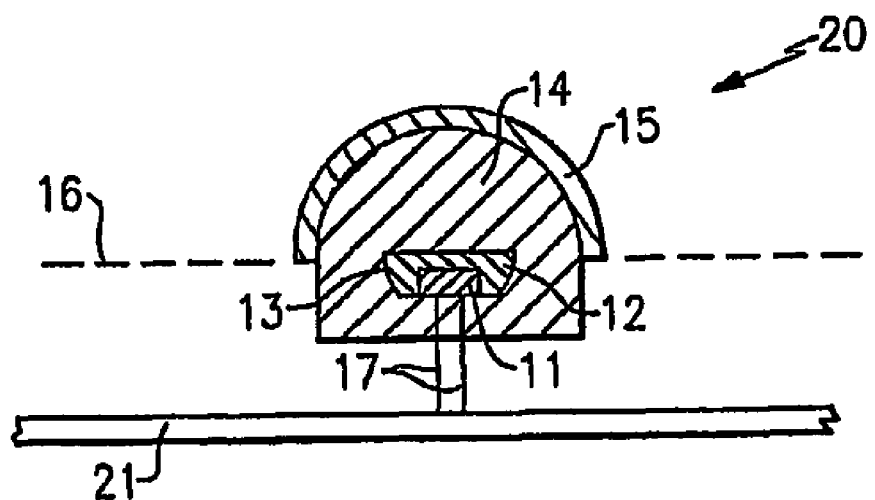

FIG. 1 shows the 1931 CIE Chromaticity Diagram.
FIG. 2 shows the 1976 Chromaticity Diagram.
FIG. 3 shows an enlarged portion of the 1976 Chromaticity Diagram, in order to show the blackbody locus in detail.
FIG. 4 depicts a first embodiment of a lighting device according to the present invention.
FIG. 5 depicts a second embodiment of a lighting device according to the present invention.

DETAILED DESCRIPTION OF THE INVENTION

As discussed above, in one aspect, the present invention provides a lighting device comprising at least one solid state light emitter, at least one first lumiphor and at least one second lumiphor, the second lumiphor being spaced from the first lumiphor. The expression "lumiphor", as used herein, refers to any luminescent element, i.e., any element which includes a luminescent material, a variety of which are readily available and well-known to those skilled in the art.

The lighting devices according to this aspect of the present invention can, if desired, comprise a plurality of solid state light emitters.

A wide variety of solid state light emitters are well-known to those skilled in the art, and any of such solid state light emitters can be employed in the lighting devices according to the present invention.

As noted above, one or more of the solid state light emitters employed in the present invention is selected from among light emitting diodes. A wide variety of light emitting diodes are well-known to those skilled in the art, and any of such light emitting diodes can be employed in the lighting devices according to the present invention. Examples of types of such light emitting diodes include inorganic and organic light emitting diodes, a variety of each of which are well-known in the art.

A wide variety of luminescent materials are well-known to those skilled in the art, and any of such luminescent materials can be employed in the lighting devices according to the present invention.

In some embodiments, a mixture of:
(1) light emitted by the at least one solid state light emitter and which exits from the at least one first lumiphor without being converted, and
(2) light emitted by the at least one solid state light emitter which exits from the at least one first lumiphor after being converted by the at least one first lumiphor (i.e., by being absorbed by the at least one first lumiphor, thereby exciting the at least one first lumiphor, and then being "re-emitted" by the at least one first lumiphor),
before passing through any additional structure which is present, has x, y color coordinates which are within an area on a 1931 CIE Chromaticity Diagram enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.45, 0.35, the second point having x, y coordinates of 0.35, 0.45, the third point having x, y coordinates of 0.12, 0.22, and the fourth point having x, y coordinates of 0.20, 0.075. In some embodiments, in addition, the one or more solid state light emitters emit light (i.e., before the light passes through any other structure, such as a first lumiphor) having any wavelength or wavelengths within the ultraviolet range or within the visible range up to a wavelength of 525 mm, e.g., any wavelength(s) within the ultraviolet range or any wavelength(s) within the visible range and having a wavelength of 500 mm or less.

The one or more first lumiphors and the one or more second lumiphors can individually be any lumiphor, a wide variety of which, as noted above, are known to those skilled in the art. For example, each of the at least one first lumiphor and the at least one second lumiphor can individually comprise (or can consist essentially of, or can consist of) a phosphor. Each of the at least one lumiphor can, if desired, further comprise (or consist essentially of, or consist of) one or more highly transmissive (e.g., transparent or substantially transparent, or somewhat diffuse) binder, e.g., made of epoxy, silicone, glass or any other suitable material (for example, in any given lumiphor comprising one or more binder, one or more phosphor can be dispersed within the one or more binder). For example, the thicker the lumiphor, in general, the lower the weight percentage of the phosphor can be. Depending on the overall thickness of the lumiphor, the weight percentage of the phosphor could be generally any value, e.g., from 0.1 weight percent to 100 weight percent (e.g., a lumiphor formed by subjecting pure phosphor to a hot isostatic pressing procedure).

A representative first embodiment of a lighting device according to the present invention is depicted in FIG. 4. Referring to FIG. 4, the first embodiment comprises a light emitting diode 11, a first lumiphor 12, a first reflective element 13, a transparent element 14 (also referred to herein as a packaging element), a second lumiphor 15 and electrodes 17.

In this first embodiment, the light emitting diode 11 is mounted within the first lumiphor 12, which in turn is positioned within the first reflective element 13. For example, the first lumiphor 12 can be obtained by filling a cup reflector 13 with a resin material and curing it after the light emitting diode chip 11 has been mounted onto the bottom of the cup reflector 13 and then has had its cathode and anode electrodes electrically connected to the leads by way of wires (a phosphor having been dispersed in the resin material so as to be excited with light emitted from the light emitting diode chip 11) whereby, (i.e., in the orientation depicted in FIG. 4), the light emitting diode 11 and the first lumiphor 12 are "within" the first reflective element in the sense that they are located between respective interior surfaces of the first reflective element 13.

In this first embodiment, the light emitting diode 11, the first lumiphor 12 and the first reflective element 13 are all positioned within the transparent element 14. The light emitting diode 11, the first lumiphor 12, the first reflective element 13 and the transparent element 14 together are similar to analogous conventional LED packages, and can, if desired, consist of a conventional LED package, e.g., a commercially available cool light 5 mm LED package marketed by Nichia under the name "NSPW500 CS".

In the embodiment depicted in FIG. 4, there is further provided a second lumiphor 15. In this embodiment, only a portion of the external surface of the transparent element 14 is covered by the second lumiphor 15, so that reflected and/or backscattered light can easily exit the lighting device. In general, any desired portion of the external surface of the transparent element 14 can be covered by the second lumiphor 15—in the embodiment depicted in FIG. 4, the second lumiphor 15 does not cover the entire surface of the LED package, and instead is coated only down to approximately a location adjacent to the first reflective element 13 (i.e., in the orientation depicted in FIG. 4, the entirety of the external surface of the transparent element 14 which is located above an imaginary plane 16 (which imaginary plane is coplanar with the peripheral top surface of the first reflective element 13), is completely covered by the second lumiphor 15, and the remainder of the outer surface of the transparent element 14 is not covered by the second lumiphor 15 (such an arrangement covers slightly more of the transparent element 14 than would be necessary to cover all of the surface area of the transparent element 14 on which light from the light emitting diode chip 11 would impinge). According to the present invention, however, if desired the second lumiphor (or lumiphors) can instead surround (independently in contact or spaced from) any portion or all of the exterior surfaces of the transparent element).

In the embodiment depicted in FIG. 4, the second lumiphor 15 consists of a clear encapsulant consisting of Dymax light cap 9617 and YAG:CE (at a weight percentage of 4.67%).

The embodiment depicted in FIG. 4 can be achieved, e.g., by using YAG to convert a blue LED chip to cool white, and covering the exterior surface of the package with a lumiphor containing any desired luminescent material, such as one or more phosphor (such as YAG, or any other phosphor, such as green, red, etc., which opens up the resultant color spectrum).

The one or more second lumiphor can be provided in any suitable manner, e.g., by coating (e.g., by dipping, painting, spraying, electrostatically applying, etc.) on a transparent element (if provided), or by casting or molding (e.g., liquid molding, injection molding, transfer molding, etc.).

Light exiting the lighting device depicted in FIG. 4 is in a spectrum within the range of x=0.35 to 0.40 and y=0.40 to 0.48 (which is, for many people and/or situations, more pleasant), and the efficacy of the LED fixture (i.e., relative to a device which is similar but does not include the second lumiphor 15) is maintained, or actually improved.

FIG. 5 depicts a second embodiment of a lighting device according to the present invention. Referring to FIG. 5, there is shown a lighting device 20 which comprises a light emitting diode 11, a first lumiphor 12, a first reflective element 13, a transparent element 14 and a second lumiphor 15 as in the first embodiment, and which comprises a second reflective element 21 below (in the orientation shown in the illustration) the light emitting diode package.

Although the outer surface of the transparent element in the embodiments depicted in FIGS. 4 and 5 is substantially dome-shaped, it can be of generally any desired shape (e.g., flattened or even irregular).

In such devices, the light emitting diode excites the luminescent material contained in the first lumiphor to generate light (e.g., a cool white light of about 5600 K), and this light then impinges on the second lumiphor. Some of the cool light reflects back off the second lumiphor and is back-reflected out of the package (as noted above, the size of the light emitting diode is preferably much smaller relative to the size of the second lumiphor, so very little light is absorbed in the light emitting diode chip as a result of the back-reflection). For example, according to the present invention, a yellowish light can be achieved which provides about 60 lumens per watt, whereas other conventional yellowish light designs have such high backscattering into the chip that they provide only about 14 lumens per watt—the key is that according to some of the embodiments of the present invention, a large portion of any non-converted light is captured as a result of it exiting the package onto a reflective surface.

In any of the lighting devices according to the present invention, including the first and second embodiments described above, the at least one second lumiphor can, if desired, consist of a plurality of second lumiphor elements, any combination of which can be connected to each other and/or separate from each other. For example, a lighting device according to the present invention can, if desired, have multiple second lumiphors which are physically separated from one another and which are positioned in different respective planes. If desired, where a plurality of second lumiphors are provided, the respective second lumiphors can be positioned such that light emitted from the first lumiphor and exiting the lighting device at a location which is above the reflective element (e.g., above the plane 16 as depicted in FIG. 4) must pass through at least one of the second lumiphors.

In some embodiments according to the present invention, the surface area of the one or more second lumiphor is at least twice as large as the surface area of the one or more solid state light emitter (or the surface area of the one or more first lumiphors), and in some embodiments, this ratio is larger (e.g., three times, four times, five times, six times, seven times, or even ten or more times).

Similarly, lighting devices according to the present invention can, if desired, include a plurality of first lumiphors positioned in any desired manner.

In a representative example, a 5 mm packaged LED is employed, because such a packaged LED can be stood off a printed circuit board and a reflector layer added.

The extent to which the second lumiphor surrounds the first lumiphor (and/or any transparent or substantially transparent element positioned between the first lumiphor and the second lumiphor) can be determined, e.g., in an embodiment as shown in FIG. 4, based on the viewing angle of the LED chip out of the first reflective element 13 (i.e., by drawing lines from the light emitting diode chip 11 through just above the top of the first reflective element 13, it is possible to envision where the light from the LED package would impinge on the outer surface of the LED package, i.e., on the outer surface of the transparent element 14). In other words, in embodiments which include a transparent element, at least the portion of the surface of the inside of the dome of the transparent element which is impinged with light from the LED chip is preferably covered by the second lumiphor (where no transparent element is employed, the same consideration applies for determining the positioning of the second lumiphor or lumiphors and their relative size).

In any lighting devices according to the present invention, one or more air spaces can be provided anywhere between the one or more first lumiphors and the one or more second lumiphors (alone or in addition to one or more transparent or substantially transparent media).

The luminescent material (or materials) can be any desired luminescent material. As noted above, persons skilled in the art are familiar with, and have ready access to, a wide variety of luminescent materials. The one or more luminescent materials can be down-converting or up-converting, or can include a combination of both types. For example, the first lumiphor can comprise one or more down-converting luminescent materials.

For example, the one or more luminescent materials can be selected from among phosphors, scintillators, day glow tapes, inks which glow in the visible spectrum upon illumination with ultraviolet light, etc.

The one or more luminescent materials, when provided, can be provided in any desired form. For example, the luminescent element can be embedded in a resin (i.e., a polymeric matrix), such as a silicone material, an epoxy or a glass.

The sources of visible light in the lighting devices of the present invention can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively connected) to any desired power source, persons of skill in the art being familiar with a variety of such power sources.

For example, light emitting diodes and lumiphors which may be used in practicing the present invention are described in:

(1) U.S. Patent Application No. 60/753,138, filed on Dec. 22, 2005, entitled "Lighting Device" (inventor: Gerald H. Negley), the entirety of which is hereby incorporated by reference;

(2) U.S. Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven), the entirety of which is hereby incorporated by reference;

(3) U.S. Patent Application No. 60/808,702, filed on May 26, 2006, entitled "Lighting Device" (inventors: Gerald H. Negley and Antony Paul van de Ven), the entirety of which is hereby incorporated by reference;

(4) U.S. Patent Application No. 60/808,925, filed on May 26, 2006, entitled "Solid State Light Emitting Device and Method of Making Same" (inventors: Gerald H. Negley and Neal Hunter), the entirety of which is hereby incorporated by reference;

(5) U.S. Patent Application No. 60/802,697, filed on May 23, 2006, entitled "Lighting Device and Method of Making" (inventor: Gerald H. Negley), the entirety of which is hereby incorporated by reference;

(6) U.S. Patent Application No. 60/839,453, filed on Aug. 23, 2006, entitled "LIGHTING DEVICE AND LIGHTING METHOD" (inventors: Antony Paul van de Ven and Gerald H. Negley), the entirety of which is hereby incorporated by reference;

(7) U.S. Patent Application No. 60/857,305, filed on Nov. 7, 2006, entitled "LIGHTING DEVICE AND LIGHTING METHOD" (inventors: Antony Paul van de Ven and Gerald H. Negley), the entirety of which is hereby incorporated by reference;

(8) U.S. Patent Application No. 60/851,230, filed on Oct. 12, 2006, entitled "LIGHTING DEVICE AND METHOD OF MAKING SAME" (inventor: Gerald H. Negley), the entirety of which is hereby incorporated by reference; and (9) U.S. Patent Application No. 60/839,453, filed on Aug. 23, 2006, entitled "LIGHTING DEVICE AND LIGHTING METHOD" (inventors: Antony Paul van de Ven and Gerald H. Negley), the entirety of which is hereby incorporated by reference.

Representative examples of arrangements of sources of visible light, mounting structures, schemes for mounting sources of visible light, apparatus for supplying electricity to sources of visible light, housings for sources of visible light, fixtures for sources of visible light, power supplies for sources of visible light and complete lighting assemblies, all of which are suitable for the lighting devices of the present invention, are described in:

(1) U.S. Patent Application No. 60/752,753, filed on Dec. 21, 2005, entitled "Lighting Device" (inventors: Gerald H. Negley, Antony Paul van de Ven and Neal Hunter), the entirety of which is hereby incorporated by reference;

(2) U.S. Patent Application No. 60/798,446, filed on May 5, 2006, entitled "Lighting Device" (inventor: Antony Paul van de Ven), the entirety of which is hereby incorporated by reference;

(3) U.S. Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), the entirety of which is hereby incorporated by reference;

(4) U.S. Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), the entirety of which is hereby incorporated by reference;

(5) U.S. Patent Application No. 60/809,618, filed on May 31, 2006, entitled "LIGHTING DEVICE AND METHOD OF LIGHTING" (inventors: Gerald H. Negley, Antony Paul van de Ven and Thomas G. Coleman), the entirety of which is hereby incorporated by reference; and (6) U.S. Patent Application No. 60/858,558, filed on Nov. 13, 2006, entitled "LIGHTING DEVICE, ILLUMINATED ENCLOSURE AND LIGHTING METHODS" (inventor: Gerald H. Negley), the entirety of which is hereby incorporated by reference.

For example, fixtures, other mounting structures and complete lighting assemblies which may be used in practicing the present invention are described in:

(1) U.S. Patent Application No. 60/752,753, filed on Dec. 21, 2005, entitled "Lighting Device" (inventors: Gerald H. Negley, Antony Paul van de Ven and Neal Hunter), the entirety of which is hereby incorporated by reference;

(2) U.S. Patent Application No. 60/798,446, filed on May 5, 2006, entitled "Lighting Device" (inventor: Antony Paul van de Ven), the entirety of which is hereby incorporated by reference;

(3) U.S. Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), the entirety of which is hereby incorporated by reference;

(4) U.S. Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), the entirety of which is hereby incorporated by reference;

(5) U.S. Patent Application No. 60/809,618, filed on May 31, 2006, entitled "LIGHTING DEVICE AND METHOD OF LIGHTING" (inventors: Gerald H. Negley, Antony Paul van de Ven and Thomas G. Coleman), the entirety of which is hereby incorporated by reference;

(6) U.S. Patent Application No. 60/858,881, filed on Nov. 14, 2006, entitled "LIGHT ENGINE ASSEMBLIES" (inventors: Paul Kenneth Pickard and Gary David Trott), the entirety of which is hereby incorporated by reference;

(7) U.S. Patent Application No. 60/859,013, filed on Nov. 14, 2006, entitled "LIGHTING ASSEMBLIES AND COMPONENTS FOR LIGHTING ASSEMBLIES" (inventors: Gary David Trott and Paul Kenneth Pickard), the entirety of which is hereby incorporated by reference; and (8) U.S. Patent Application No. 60/853,589, filed on Oct. 23, 2006, entitled "LIGHTING DEVICES AND METHODS OF INSTALLING LIGHT ENGINE HOUSINGS AND/OR TRIM ELEMENTS IN LIGHTING DEVICE HOUSINGS" (inventors: Gary David Trott and Paul Kenneth Pickard), the entirety of which is hereby incorporated by reference.

In addition, any desired circuitry can be employed in order to supply energy to the lighting devices according to the present invention. Representative examples of circuitry which may be used in practicing the present invention is described in:

(1) U.S. Patent Application No. 60/809,959, filed on Jun. 1, 2006, entitled "Lighting Device With Cooling" (inventors: Thomas G. Coleman, Gerald H. Negley and Antony Paul van de Ven), the entirety of which is hereby incorporated by reference;

(2) U.S. Patent Application No. 60/809,595, filed on May 31, 2006, entitled "LIGHTING DEVICE AND METHOD OF LIGHTING" (inventor: Gerald H. Negley), the entirety of which is hereby incorporated by reference; and (3) U.S. Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), the entirety of which is hereby incorporated by reference.

The devices according to the present invention can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present invention, typically only enough air to break the boundary layer is required to induce temperature drops of 10 to 15 degrees C. Hence, in such cases, strong "breezes" or a large fluid flow rate (large CFM) are typically not required (thereby avoiding the need for conventional fans).

The devices according to the present invention can further comprise secondary optics to further change the projected nature of the emitted light. Such secondary optics are well-known to those skilled in the art, and so they do not need to be described in detail herein any such secondary optics can, if desired, be employed.

The devices according to the present invention can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present invention can include a lighting device according to the present invention and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

Any two or more structural parts of the lighting devices described herein can be integrated. Any structural part of the lighting devices described herein can be provided in two or more parts (which can be held together, if necessary).

The invention claimed is:

1. A lighting device, comprising:
    at least one solid state light emitter; and
    at least first and second lumiphors, said second lumiphor comprising at least one luminescent material and at least one binder, said second lumiphor spaced from said first lumiphor, said first lumiphor in direct contact with said solid state light emitter, at least a portion of said first lumiphor between said solid state light emitter and said second lumiphor.

2. A lighting device as recited in claim 1, wherein said lighting device comprises a plurality of solid state light emitters.

3. A lighting device as recited in claim 1, wherein said lighting device comprises a plurality of said first lumiphors.

4. A lighting device as recited in claim 1, wherein said lighting device comprises a plurality of said second lumiphors.

5. A lighting device as recited in claim 1, further comprising a first reflective element, said solid state light emitter and said first lumiphor within said first reflective element.

6. A lighting device as recited in claim 5, further comprising a second reflective element.

7. A lighting device as recited in claim 1, further comprising at least one packaging element, said packaging element completely surrounding said at least one solid state light emitter and said at least one first lumiphor.

8. A lighting device as recited in claim 7, wherein said packaging element is substantially transparent.

9. A lighting device as recited in claim 1, wherein at least one region of air is between said first lumiphor and said second lumiphor.

10. A lighting device as recited in claim 1, wherein a surface area of said second lumiphor is at least twice a surface area of said first lumiphor.

11. A lighting device as recited in claim 1, wherein a mixture of:
    (1) light emitted by said at least one solid state light emitter which exits from said at least one first lumiphor without being converted, and
    (2) light emitted by said at least one solid state light emitter which exits from said at least one first lumiphor after being converted by said at least one first lumiphor,
    has x, y color coordinates which are within an area on a 1931 CIF Chromaticity Diagram enclosed by first, second, third and fourth line segments, said first line segment connecting a first point to a second point, said second line segment connecting said second point to a third point, said third line segment connecting said third point to a fourth point, and said fourth line segment connecting said fourth point to said first point, said first point having x, y coordinates of 0.45, 0.35, said second point having x, y coordinates of 0.35, 0.45, said third point having x, y coordinates of 0.12, 0.22, and said fourth point having x, y coordinates of 0.20, 0.075.

12. A lighting device as recited in claim 1, wherein said solid state light emitter emits light having a wavelength within the ultraviolet range or within the visible range up to a wavelength of 525 mm.

13. A lighting device as recited in claim 1, wherein said binder is substantially transparent.

14. A lighting device as recited in claim 1, wherein said binder is selected from among the group consisting of epoxies, silicones and glasses.

15. A lighting device as recited in claim 1, wherein said second lumiphor further comprises at least one additive selected from among the group consisting of diffusers, scatterers and tints.

16. A method of making a lighting device, comprising:
    positioning a solid state light emitter, a first lumiphor, and a second lumiphor relative to one another such that said second lumiphor is spaced from said first lumiphor, said first lumiphor is in direct contact with said solid state light emitter, and at least a portion of said first lumiphor is located between said solid state light emitter and said second lumiphor, said second lumiphor comprising at least one luminescent material and at least one binder.

17. A method of lighting, comprising:
    providing electricity to at least one solid state light emitter, whereby said solid state light emitter emits light, at least some of which passes through a first lumiphor, then through a second lumiphor, and then mixes with at least some light emitted from said second lumiphor, said first lumiphor spaced from said second lumiphor, at least a portion of said first lumiphor between said solid state light emitter and said second lumiphor, said second lumiphor comprising at least one luminescent material and at least one binder.

18. A lighting device, comprising:
at least one solid state light emitter; and
at least first and second lumiphors, said second lumiphor comprising at least one luminescent material and at least one binder., said second lumiphor spaced from said first lumiphor, at least a portion of said first lumiphor between said solid state light emitter and said second lumiphor, wherein if said solid state light emitter is illuminated, at least some light emitted from said solid state light emitter would mix with at least some light emitted from said second lumiphor.

* * * * *

UNITED STATES PATENT AND TRADEMARK OFFICE
CERTIFICATE OF CORRECTION

PATENT NO. : 8,264,138 B2  
APPLICATION NO. : 11/624811  
DATED : September 11, 2012  
INVENTOR(S) : Gerald H. Negley and Antony Paul Van De Ven It is certified that error appears in the above-identified patent and that said Letters Patent is hereby corrected as shown below:

In the Claims:

Column 14, line 24
(claim 11), line 10: please change "CIF" to --CIE--.

Column 15, line 5
(claim 18), line 5: please change "binder.," to --binder,--.

Signed and Sealed this
Twenty-seventh Day of November, 2012

David J. Kappos
*Director of the United States Patent and Trademark Office*